(12) United States Patent
Kirichenko (10) Patent No.: US 7,733,253 B2
(45) Date of Patent: Jun. 8, 2010

(54) SUPERCONDUCTOR MULTI-LEVEL QUANTIZER

(75) Inventor: Dmitri Kirichenko, Pleasantville, NY (US)

(73) Assignee: HYPRES, Inc., Elmsford, NY (US)

( * ) Notice: Subject to any disclaimer, the term of this patent is extended or adjusted under 35 U.S.C. 154(b) by 128 days.

(21) Appl. No.: 12/212,605

(22) Filed: Sep. 17, 2008

(65) Prior Publication Data

US 2010/0066576 A1    Mar. 18, 2010

(51) Int. Cl.
*H03M 1/00*    (2006.01)
(52) U.S. Cl. ........................................ 341/133; 341/155
(58) Field of Classification Search ................. 341/133, 341/155, 158, 159
See application file for complete search history.

(56) References Cited

U.S. PATENT DOCUMENTS

| | | | | |
|---|---|---|---|---|
| 4,315,255 A | * | 2/1982 | Harris et al. | ................. 341/133 |
| 4,983,971 A | * | 1/1991 | Przybysz et al. | ............. 341/133 |
| 5,305,006 A | * | 4/1994 | Lee | .............................. 341/155 |
| 5,351,049 A | * | 9/1994 | Lee et al. | ...................... 341/133 |
| 5,400,026 A | | 3/1995 | Bradley | ....................... 341/133 |
| 6,157,329 A | | 12/2000 | Lee | .............................. 341/133 |
| 6,816,103 B2 | | 11/2004 | Jonsson | ....................... 341/160 |
| 7,002,504 B2 | | 2/2006 | McMahill | .................... 341/161 |
| 7,227,480 B2 | * | 6/2007 | Furuta et al. | ................. 341/133 |
| 7,598,897 B2 | | 10/2009 | Kirichenko | .................. 341/143 |

OTHER PUBLICATIONS

"Superconductor Analog-to-Digital Converters" O. Mukhanov, et al., Proc. IEEE, vol. 92, pp. 1564-1584 (2004).

* cited by examiner

*Primary Examiner*—Howard Williams
(74) *Attorney, Agent, or Firm*—George Sai-Halasz (57) ABSTRACT

A superconductor multi-level quantizer is disclosed, which quantizer includes a number N of Josephson junction (JJ) comparators connected in parallel to a common input node. The quantizer further includes at least one flux bias device. Each flux bias device is capable to adjust the flux threshold for at least one of the JJ comparators. The quantizer is so configured a feedback current from the output is capable to shift the flux threshold for each of the JJ comparators.

20 Claims, 5 Drawing Sheets

SUPERCONDUCTOR MULTI-LEVEL QUANTIZER

FIELD OF THE INVENTION

The present invention relates to superconductor electronics. In particular, it relates to quantizing analog signals in multiple levels for analog-to-digital converters (ADC).

BACKGROUND OF THE INVENTION

Superconductor analog-to-digital converters are based on the ultra fast switching times of Josephson junction (JJ) comparators, of order a picosecond. This permits ultra fast sampling rates of tens of gigahertz, leading to some of the fastest circuits in any electronic technology for both Nyquist-rate ADCs and oversampling (sigma-delta and delta type) ADCs. See, for example, the review article on Superconducting ADCs by O. Mukhanov, et al., in Proc. IEEE, vol. 92, pp. 1564-1584 (2004), incorporated herein by reference. In order to further increase the dynamic range of superconductor ADCs, it is desirable to combine multiple JJ comparators together. One prior art approach was a flash ADC using a resistor network and multiple quantizers to generate an n-bit output, see for instance, U.S. Pat. No. 5,400,026 to Bradley. However, all designs based on resistor networks require precision matching of elements to achieve the best performance. Element mismatches will generate nonlinear artifacts, limiting the spur-free dynamic range (SFDR) that is essential for many ADC applications.

The problem of element mismatches is well known in the prior art of conventional semiconductor data converters. One general approach is known as "dynamic element matching" (DEM), in which various elements and comparators are permuted by physical switching in a way that randomizes the mismatches, sharply reducing the nonlinear peaks or "spurs". See, for example, U.S. Pat. No. 6,816,103, to Jonsson, or U.S. Pat. No. 7,002,504 to McMahill.

The problem of using superconductor ADCs with multiple level sampling, or quantizing, while minimizing element mismatches is not solved.

SUMMARY OF THE INVENTION

A superconductor circuit is disclosed, which circuit includes a number N of Josephson junction (JJ) comparators, with the N being at least two. The JJ comparators are connected in parallel to a common input node, and each is capable of individual switching. Upon switching, each of the JJ comparators is producing a feedback current equivalent to a single flux quantum ($\Phi_0$), and each of the JJ comparators has a flux threshold for switching. The circuit further includes at least one flux bias device. Each flux bias device is capable to adjust the flux threshold for at least one of the JJ comparators. Furthermore, the superconductor circuit is so configured that each JJ comparator is adapted to receive at least a portion of the feedback current, and the feedback current is capable to shift the flux threshold for each of the JJ comparators.

A method is disclosed for converting an electromagnetic analog signal into a digital signal. The method includes connecting N Josephson junction (JJ) comparators in parallel to a common input node, which input node receives the analog signal. The number N is at least two. The JJ comparators have flux thresholds for switching, and such switching produces the digital signal. The method further includes adjusting the flux thresholds individually to a predetermined set of flux values, and randomizing the flux thresholds with a feedback current. The feedback current is generated by the switching of the JJ comparators.

BRIEF DESCRIPTION OF THE DRAWINGS

These and other features of the present invention will become apparent from the accompanying detailed description and drawings, wherein.

DETAILED DESCRIPTION OF THE INVENTION

Figure 1:
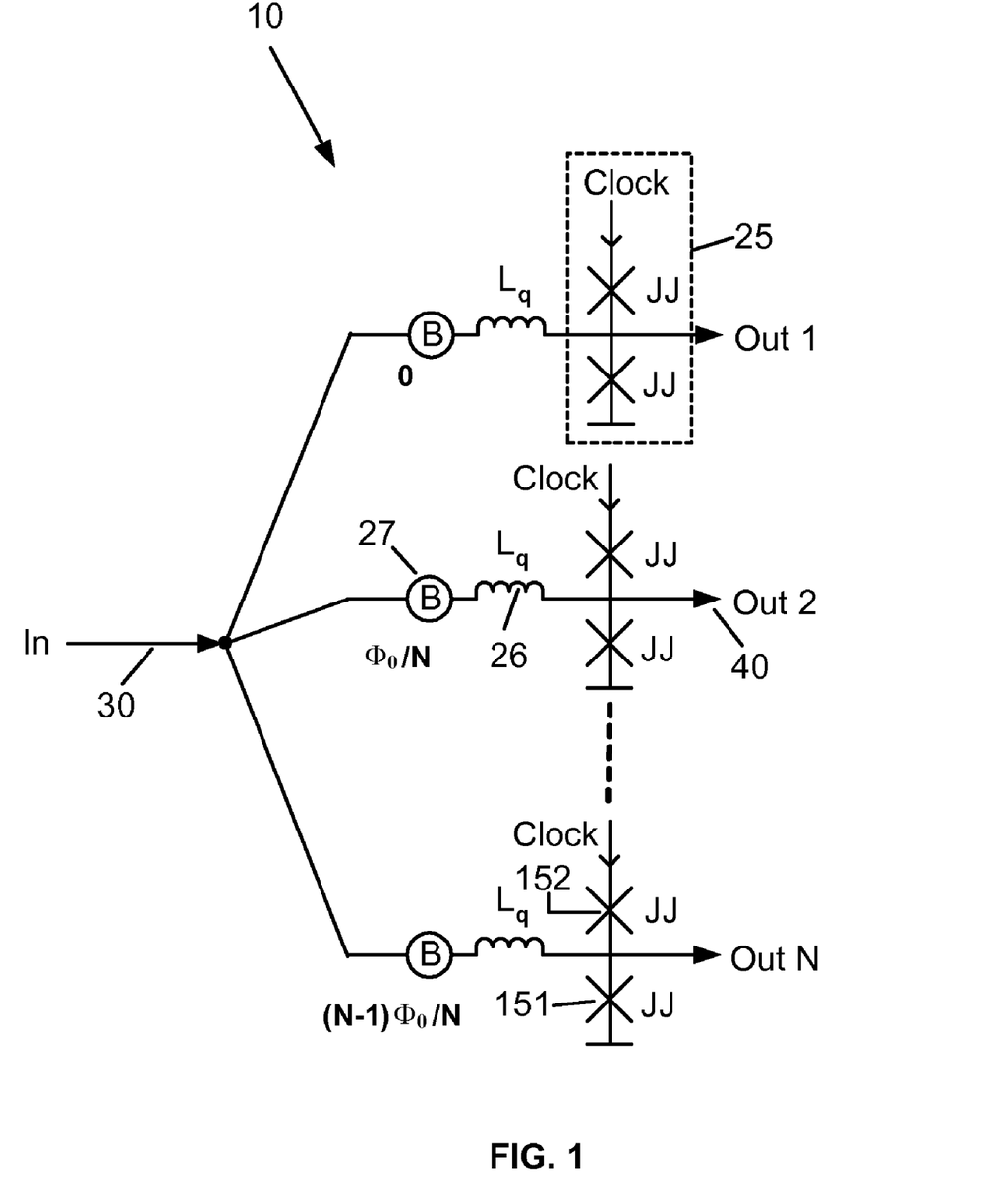
FIG. 1 shows a diagram of a multi-level quantizer with N Josephson junction comparators, each having a distinct threshold for switching.

The embodiments of the present disclosure are implemented in the general framework of superconductor rapid single-flux-quantum (RSFQ) technology. FIG. 1 shows a diagram of a multi-level quantizer 10 with N Josephson junction (JJ) comparators 25, each having a distinct threshold for switching. In embodiments of the present invention, "N" the number of JJ comparators pertaining to the multi-level quantizer 10, is at least 2.

JJ comparators are known in the art. In FIG. 1 all N comparators are depicted as being, without limitation, of a particular kind, where two JJ junctions 151, 152 are serially connected. The bottom JJ 151 is the switching comparator, while the top JJ 152 serves in the clocking. Such an arrangement has been known in the art. In a niobium (Nb), nominally 1 μm, technology such a comparator is capable of a pulse rate close to 50 GHz. With a technology of submicron groundrules a pulse rate exceeding 100 GHz is achievable.

An input signal induces a current in the lower junction 151. If the input current exceeds a threshold, then a clock pulse will trigger the lower JJ 151 to switch, generating a single-flux-quantum, $\Phi_0$=h/2e=2.07 mV-ps, (SFQ) pulse to the output 40 on the right. Simultaneously, a reverse magnetic flux of $\Phi_0$ is directed toward the input 30 on the left, which manifest itself as a feedback current. Such feedback current in JJ comparators has already been disclosed, for instance, in U.S. Pat. No. 6,157,329 to Lee et al., or in U.S. patent application Ser. No. 11/955,666 filed Dec. 13, 2007, both of which are incorporated herein by reference, and in the aforementioned review article by Mukhanov. In representative embodiments of the invention the JJ comparators 25 are fabricated to be nominally identical, with the net result that, due to unavoidable minor processing differences, the JJ comparators 25 maybe regarded as essentially identical.

A loop inductor 26, with an inductance value of $L_q$, pertains to each of the JJ comparators 25. The loop inductors 26 are joined to the JJ comparators 25. The loop inductors 26, pertaining to each of the JJ comparators, have nominally identical values.

The threshold for switching in the JJ comparators 25 can equivalently be discussed in term of currents, or in term of magnetic fluxes. In terms of flux, when the flux inside the switching junction 151 of JJ comparator 25 reaches approximately $\Phi_0$, the junction switches when triggered by the clock pulse, with the precise switching flux depending on the junction critical current $I_c$, the dc bias current, and the loop inductor $L_q$. The loop inductors 26 are positioned in a manner that a current "I" flowing through a loop inductor 26 results an $I \times L_q$ flux change in the switching JJ junction 151. The loop inductors 26 are capable of transforming a current into flux change in the JJ comparators 25.

In representative embodiments of the invention the multi-level quantizer 10 employs bias devices 27 in series with the JJ comparators 25. A bias device 27, also called a phase source, is a source of a magnetic flux capable to enter the JJ comparator 25. Thus, the magnetic flux produced by a bias device 27 is capable to adjust the flux threshold of a JJ comparator 25. The amount of flux produced by a given bias device 27 may be set externally in a variety of manners. The adjustment of the switching threshold of a JJ comparator 25 due to the flux of a bias device 27 is simply referred to as a flux bias.

In FIG. 1 many of the elements appear multiple times, just as multiple copies of them are present in embodiments of the multi-level quantizer 10. Such elements typically are noted with a single indicator number in FIG. 1, to avoid clutter. But, it is understood that similarly depicted elements both collectively, and individually, are referred to with the same indicator number as one copy of them is marked in FIG. 1. Thus, for instance, bias devices 27, and a single bias device 27 are all referred to as "27", same way for loop inductors "26", and same with other elements. When, for some reason, such nominally identical elements need individual distinction, it would be duly noted.

In a preferred embodiment of the invention one may use N flux biases spanning a range of $\Phi_0$, in equal intervals. The flux bias devices 27 are adapted to adjust the flux thresholds of the N JJ comparator 25 to differ from one another essentially by $\Phi_0/N$. Consequently, the flux thresholds may be individually adjusted to a predetermined set of flux values. If the flux bias devices 27 were absent, or all the flux thresholds were set to be identical, then the JJ comparators 25 would be essentially identical with one another.

For illustration, but without limitation, let's take the example of N=3. The flux biases may be 0, $\Phi_0/3$, and $2\Phi_0/3$. These flux biases may create a set of flux thresholds at 3, 2, and 1, in units of $\Phi_0/3$, respectively.

In embodiments of the invention the N JJ comparators 25 of the multi-level quantizer 10 are connected in parallel to a common input node 30, which input node 30 receives the analog signal to be quantized. The effective total inductance, $L_T$, from the input signal's view is $L_T = L_q/N$, since there are N loop inductors 26 in parallel, each with a nominal inductance of $L_q$.

Continuing with the example of N=3, and with the flux thresholds differing from one another by $\Phi_0/N$, if the input current is I, then this splits evenly, and the input flux to each comparator is $L_q I/3$, or $L_q I/\Phi_0$ in units of $\Phi_0/3$. Consequently, an incoming analog input signal of a given size, arriving to the common input node 30, is partitioned into four equal ranges (0,1), (1,2), (2,3), and (3,4). An input signal flux in each range would generate, respectively, 0, 1, 2, or 3 output pulses 40 each clock period. When an input signal during a clock cycle is too small to cause switching even in the JJ comparator 25 with the lowest flux threshold, the output during that clock cycle is 0 output pulse, since none of the JJ comparators 25 has been switched.

For some flux biasing schemes it may happen that one of the JJ comparators 25 receives 0 flux bias. Consequently, the JJ comparator 25 receiving the 0 bias may be in no need of a bias device 27. In embodiments of the invention the number of bias devices 27 in the multi-level quantizer 10 maybe less than N. However, the multi-level quantizer 10 contains at least one of the bias devices 27.

In the representation of FIG. 1 the bias device 27, the loop inductor 26, and the JJ comparator 25, are shown in a specific order, and in series. This is for illustration purposes only, and it may facilitate a description of the electrical operation of the circuit. However, the illustration of FIG. 1, neither in the order of the components, neither in their separateness, should be interpreted as a limitation, or restriction on the actual physical implementation of the superconductor circuit, especially when using the techniques of microelectronics. Due to mutual inductances and self inductances of the superconductive lines, the integration of the bias device 27, the loop inductor 26, and the JJ comparator 25 may be realized in many ways.

As stated earlier, each time an output pulse 40 is generated by a given JJ comparator 25, that comparator inherently generates a feedback current, with at least a portion of this feedback current reaching all the JJ comparators 25. If the flux thresholds were biased to differ from one another by $\Phi_0/N$, then the feedback current from a single output pulse 40 cyclically permutates the threshold values of JJ comparators 25. The same threshold values would be present, but they would be assigned to different comparators.

Figure 2A:
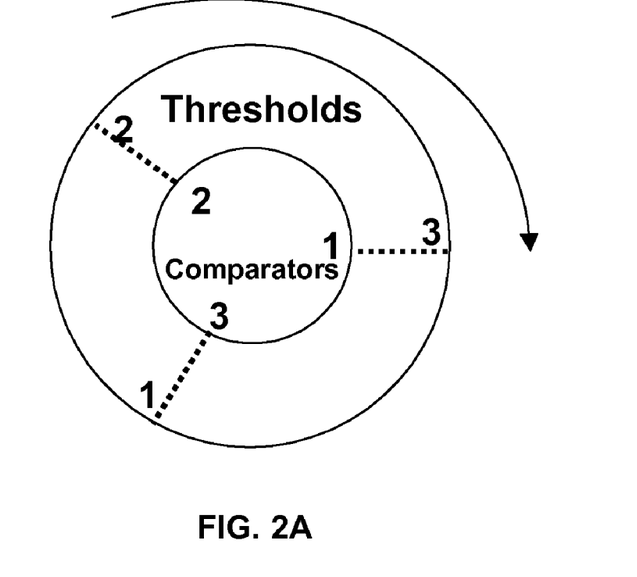
FIGS. 2A, 2B show an illustration of and example cyclic permutation of thresholds for N=3.
Figure 2B:
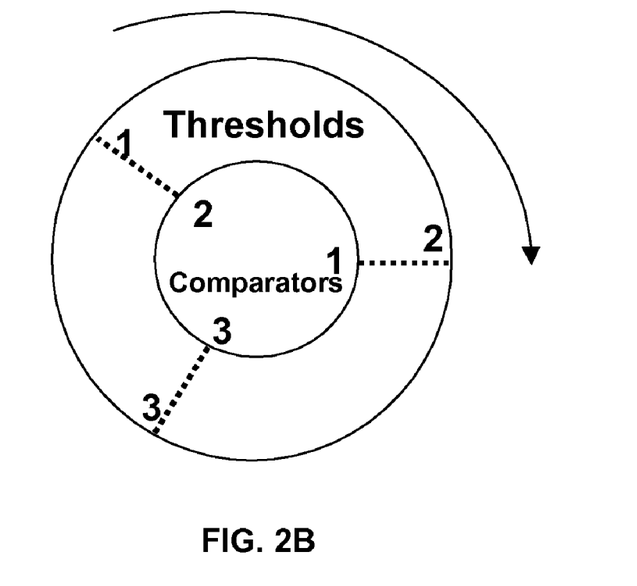

One has to consider the feedback flux $\Phi_0$, which is sent backwards toward the input node 30 whenever an SFQ pulse is emitted by a given comparator 25. Continuing with the example of N=3, consider first the case where only one SFQ pulse is emitted from the bottom comparator (#3). The feedback flux corresponds to current flowing around an entire superconducting loop, namely all N parallel paths ultimately originating from the common input node 30, with the bottom comparator (#3) as its source. From this viewpoint, the loop consists of a the bottom inductance $L_q$ in series with the parallel combination of two other $L_q$'s, for a combined loop inductance of $L_{co}=3L_q/2$. Then the total loop current from this feedback is $\Phi_0/L_{co}=2\Phi_0/3L_q$, and a portion of this current arrives to all JJ comparators 25. This leads to a flux shift of $-2/3\Phi_0$ for comparator #3, and $+1/3\Phi_0$ for comparators #1 and #2. This has the effect of shifting the threshold up by 2 for #3, and down by 1 for the other two, in units of $\Phi_0/3$. So after the pulse emission, the thresholds that were 3, 2, and 1 respectively, are now 2, 1, and 3 respectively. In other words, they have been cyclically permuted, as shown schematically by the threshold wheel rotating clockwise around the comparator wheel in FIG. 2A, leading to FIG. 2B. At the next clock period, if the analog input signal is unchanged, only the middle comparator (#2) will now trigger. This generates a feedback threshold shift of +2 for the middle comparator and −1 for the top (#1) and bottom (#3). This further rotates the thresholds from 2, 1, and 3, to 1, 3, and 2. Now the low-threshold comparator is on the top (#1). On the third clock pulse, only the top comparator triggers, followed by feedback threshold rotation back to the initial configuration.

In the real operation of the multi-level quantizer 10, the analog input on the input node 30 will vary with time. Lets consider the condition that the input signal size is in the (2,3) range, and threshold configurations 3, 2, and 1 from top to bottom. Then comparators with thresholds 3 and 2 will both trigger, sending two SFQ pulses to the right. Each of these will then generate feedback fluxes, giving a net effect that will be the superposition of the two. Triggering bottom comparator (#3) shifts, as detailed earlier, to 2, 1, and 3, and triggering middle comparator (#2) shifts this to 1, 3, and 2, both before the next clock pulse. This corresponds to a double rotation, or a single rotation in the reverse direction. Similarly, if all three comparators trigger, that corresponds to a triple rotation of the threshold, which brings it back to the initial configuration. And of course at the smallest input, when no pulses are triggered, there are also no changes in thresholds.

More generally, for N thresholds, the thresholds will not change for a signal at the very top, or bottom, of the range, but will rotate at n steps per clock period for n comparators triggering (n<N). For a typical high-frequency signal that spans much of the signal strength range, the thresholds will rapidly rotate in a pseudo-random fashion among all configurations. The threshold are constantly being reordered amongst the JJ comparators 25, in effect randomizing the flux thresholds.

This randomizing of the flux thresholds with the feedback current has advantages. If the thresholds or various element values are slightly mismatched between the various parallel paths ultimately originating from the common input node 30, these permutations randomize the mismatches in a way that reduces static nonlinearities, creating instead some excess random noise. This would permit an increase in the spur-free dynamic range (SFDR), a key figure of merit in ADCs for communications and other applications. Furthermore, all comparators will have an equal significance and weighting in the generation of the digital output, so all have the same precision requirements.

Such a randomizing effect is well known to be highly desirable for analog to digital data conversions. It is similar in effect to "dynamic element matching" in conventional ADCs, but that requires extensive switching networks to physically permute device elements. In embodiments of the present invention, due to the special feedback characteristics of JJ comparators 25, this is achieved automatically without any physical switching.

While these effects have been illustrated here for a 3-level, 2-bit digitizer, this can be directly extended to a larger number of levels. For example, 7 levels would yield a 3-bit digitizer. A larger number of levels requires that the input analog power be carefully split among each of the N comparators, but that may not be difficult. Using a binary tree for this purpose could be an additional option, particularly if an analog preamplifier is available.

The N equal-weighted parallel outputs of the multi-level quantized 10, are commonly referred to as a thermometer code. Such a code can be converted to a standard n-bit binary signal using a parallel binary counter. A parallel binary counter is already available in rapid-single-flux-quantum (RSFQ) superconductor technology. For example, a similar circuit is used for the input stage to a digital decimation filter from a superconductor low-pass analog-to-digital converter.

The N threshold levels permit the effective number of output binary bits to be increased by $\log_2(N+1)$. Thus, if N=3, one obtains 2 binary bits, and for N=7, one obtains 3 binary bits, and so on. Hence, embodiments with a number N equal to $2^n-1$, where n is a positive integer greater than 1, are of special interest.

Figure 3:
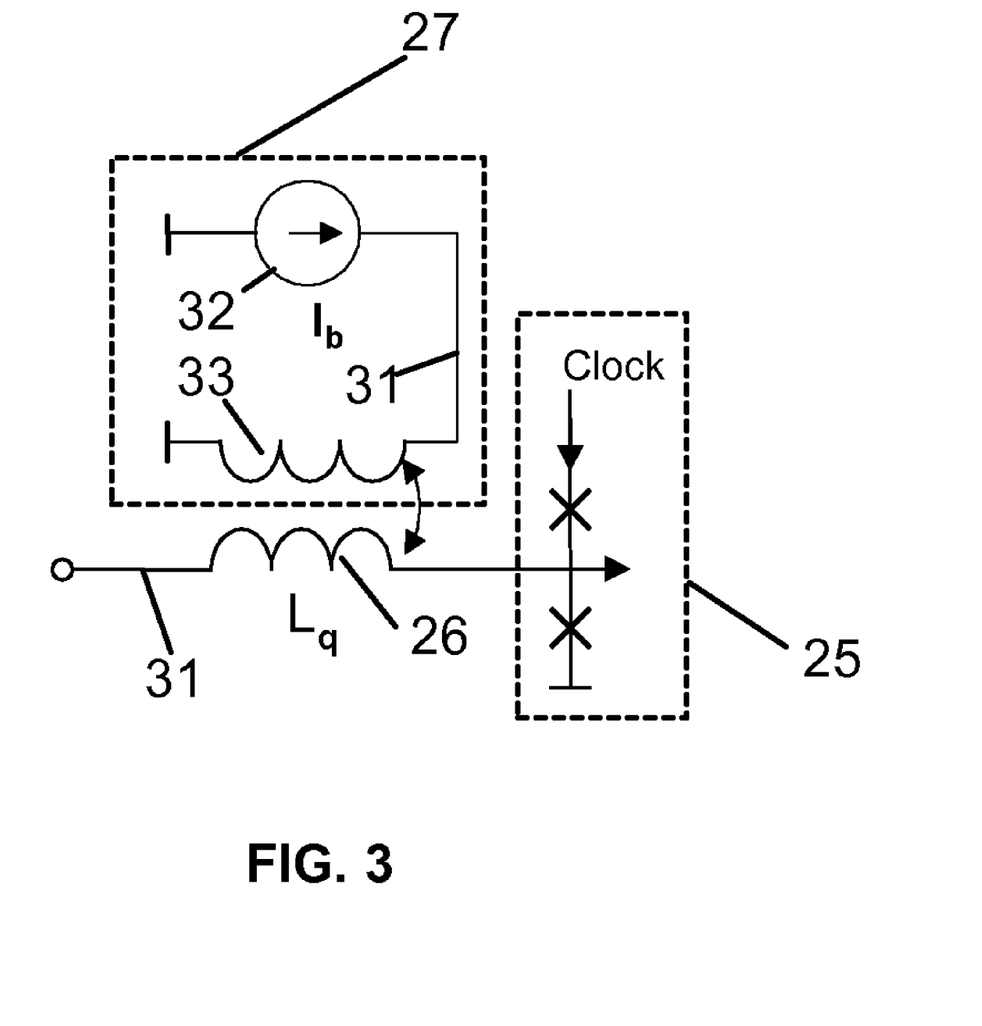
FIG. 3 shows a schematic of a flux bias device for a representative embodiment of the invention.

FIG. 3 shows a schematic of a flux bias device 27 for a representative embodiment of the invention. The flux bias is simply magnetic flux that is coupled into the loop of the switching JJ 151. There are many possibilities to accomplish this, that may be known for one skilled in the art. For instance, one could use a properly positioned ferromagnetic material. Also, as in a typical embodiment of the present invention, the small flux values that are required can easily be obtained using a simple inductive coupling of two superconducting lines 31, as shown in FIG. 3. For example, a flux of $\Phi_0/3$=0.7 pH·mA=M×$I_b$, and can be obtained using a dc bias current 32, $I_b$, of 0.25 mA and a mutual inductance M=3 pH. The mutual inductance 33 could easily be achieved in an integrated circuit by overlap of an isolated input microstrip 31 and the loop inductor $L_q$ 26 pertaining to the comparator 25, with dimensions on the μm scale ($\mu_0$=1.26 pH/μm). Using the inductive coupling between superconductor lines, one may electrically change the flux amount produced by the flux bias device 27. It may also be possible to supply more than one JJ comparator 25 from one suitable bias current 32, with properly integrated inductance loops.

The bias current 32 in the transformer input would be held constant during normal operation, but could be carefully tuned during initial ADC setup to minimize system noise. In a situation with static mismatches, the system output typically depends on these in a highly nonlinear interactive fashion. In contrast, the dynamic averaging associated with threshold permutation is expected to largely decouple the various mismatches, so that tuning of the flux biases to minimize noise should converge rather quickly.

In typical embodiments of the inventions the bias currents 32 may be tuned individually for each bias device 27, to optimize the quantization noise of the ADC. The permuting comparators may lead to independent noise contributions of each of the flux biases, so that sequential optimization under full computer control may be feasible. Such an operation may involve the monitoring a digital noise in the output digital signal, and controlling the changing of the flux amount to minimize the digital noise.

Figure 4:
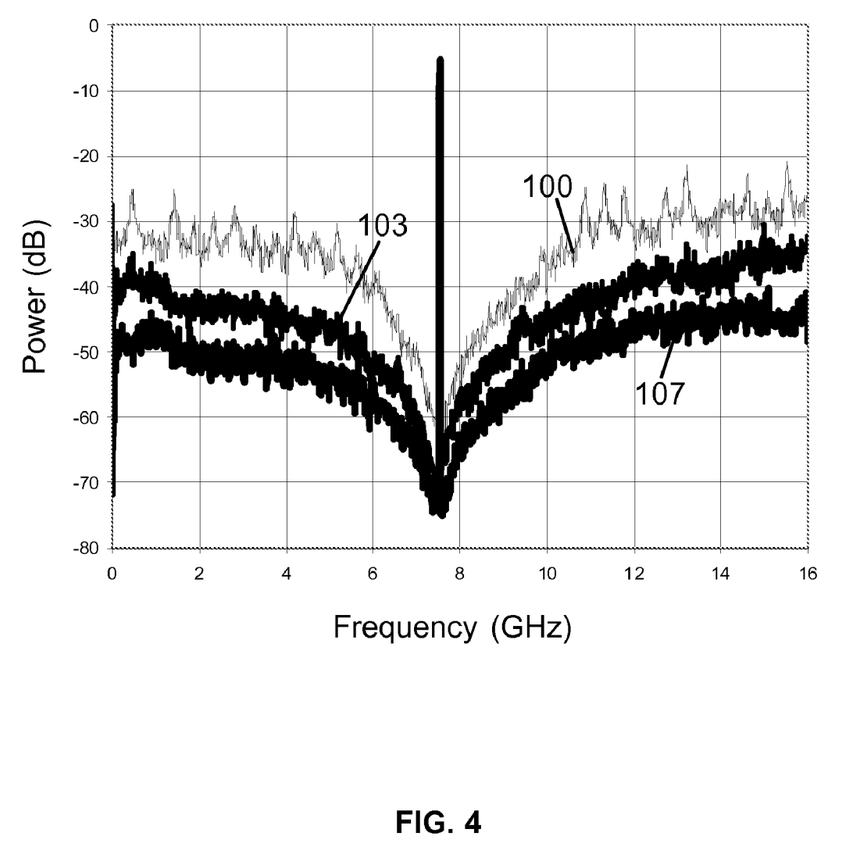
FIG. 4 shows a simulated digital output spectra of a bandpass multi level quantizer for N=1, 3, and 7 threshold levels.

FIG. 4 shows a time-domain simulation of the digital output spectra of a bandpass multi-level quantizer 10 for N=1, curve 100; N=3, curve 103, and N=7, curve 107, JJ comparators 25. The simulation assumes that the multi-level quantizer 10, with various number of JJ comparators 25, is built into a bandpass ADC system, as known in the art. The input part for the simulated bandpass ADC is element 201' in FIG. 5, where it is shown as a possible embodiment, as known in the art, for a system containing the bandpass multi-level quantizer 10.

Figure 5:
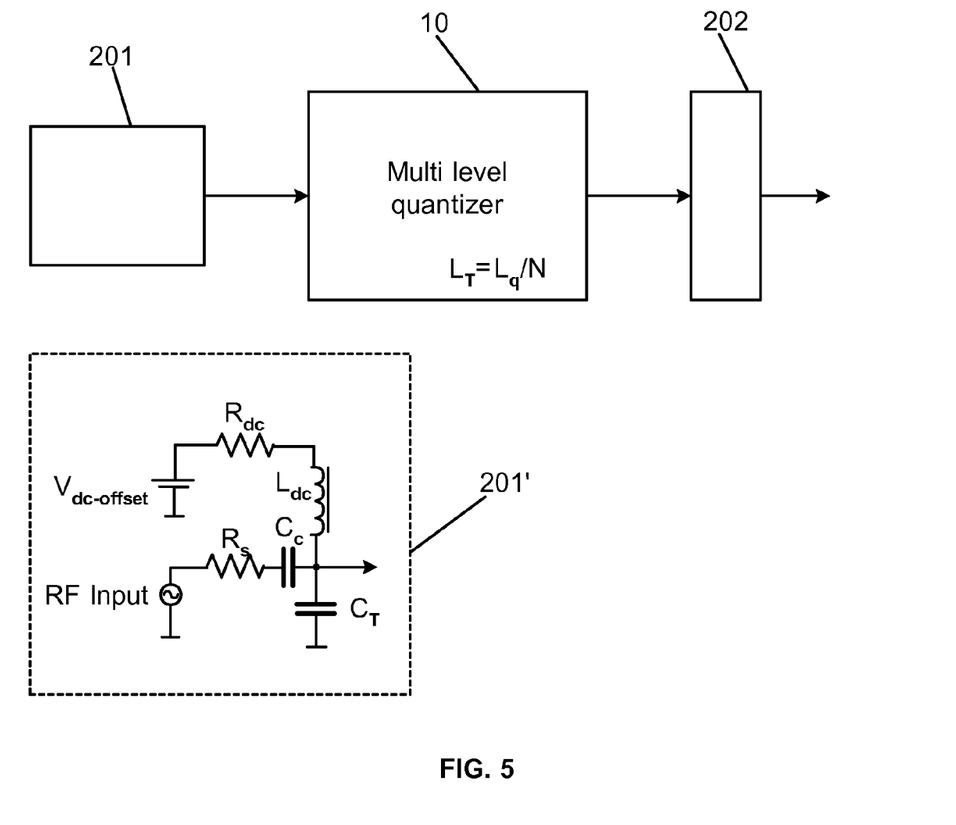
FIG. 5 gives a symbolic representation of a superconductor Analog-to-Digital Converter (ADC) having a multi-level quantizer.

Strictly for illustration purposes, without intent of restricting, or limiting, the simulation used the following circuit parameters for the N=3, line 103, case. The various components referred to are shown as element in the dotted box 201' of FIG. 5, as well as in FIG. 2. For all JJ-s 151, in the comparators 25: critical current 260 mA, normal resistance 2.1 Ohm, capacitance 0.29 pF; loop inductors $L_q$, 26: 290 pH; resonator capacitor, $C_T$: 4.6 pF; input coupling capacitor $C_c$: 0.046 pF; DC offset inductor $L_{dc}$: 26 nH; DC offset resistor $R_{dc}$: 0.1 Ohm; DC offset voltage $V_{dc\text{-}offset}$: 64 μV; clock sources: synchronous single flux pulses with 32 GHz repetition rate; RF Input voltage source: frequency 7.5 GHz, amplitude 4.75 mV; RF Input source impedance $R_S$: 50 Ohm; flux biases 0, $\Phi_0/3$, $2\Phi_0/3$. The resonant bandpass frequency is:

$$1/2\pi(L_T C_T)^{1/2} = 1/2\pi(L_q C_T/N)^{1/2} = 7.5 \text{ GHz}.$$

The input signal power at 7.5 GHz was set to −3 dB of modulators' full scale power. The voltage output waveform thus generated was converted into a digital time series of 1024 points, and then subjected to a digital Fourier transform. This was then squared to generate the power spectral density, which is shown in FIG. 4. The simple sinewave input at 7.5 GHz shows up as a narrow peak at that frequency, and the sigma-delta noise-shaping is clearly evident in a dip in the quantization noise around 7.5 GHz. The larger the number of quantizers, the deeper is the noise suppression.

The dynamic range (signal-to-noise ratio SNR) is obtained by subtracting from the peak power the total integrated noise in the relevant band. SNR values were calculated for a 500 MHz band centered at 7.5 GHz. The results are as follows:

1-level: 38.1 dB, 3-levels: 45.0 dB, 7-levels: 50.3 dB. As expected, the dynamic range increases with increasing number of quantization levels.

FIG. 5 gives a symbolic representation of superconductor Analog-to-Digital Converter (ADC) having a multi-level quantizer 10. Typically such a system has a front end, 201, which chiefly determines the character of the ADC. There are many ADC-s known in the art, and the multi-level quantizer 10 may be useful component for any of them. The total inductance, $L_T$, that the multi-level quantizer 10 is presenting to the input stage 201 is $L_T=L_q/N$. Without limitation, one may consider various front end 201 configurations, which would turn the system to a bandpass ADC, or to a low pass ADS, or to a general oversampled ADC. For the case of a bandpass ADC system, a possible front end 201 is shown in some detail inside the 201' dotted square of FIG. 5.

Since, as discussed already, the output of the multi-level quantizer 10 is a thermometer code, it is preferable to convert it in an end stage 202 to standard binary code. Such an end stage 202 may be a digital converter adapted to convert a digital output from the multi-level quantizer into a multibit binary code. Such converters in superconductor technology are known in the art.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature, or element, of any or all the claims.

The terminology was used for the purpose of describing particular embodiments only, and is not intended to be limiting of the invention. As used, the singular terms "a", "an" and "the" are intended to include the plural forms as well, unless the context clearly indicated otherwise. It will be further understood that such terms as "comprises," "includes," "contains," "has," when used, specify the presence of stated features, integers, steps, operations, elements, and/or components, but do not preclude the presence or addition of one or more other features, steps, operations, elements, components, and/or groups thereof.

Unless otherwise defined, all terms (including technical and scientific terms) used have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined.

Many modifications and variations of the present invention are possible in light of the above teachings, and could be apparent for those skilled in the art. The scope of the invention is defined by the appended claims.

I claim:

1. A superconductor circuit, comprising:
   a number N of Josephson junction (JJ) comparators, with said N being at least two, said JJ comparators are connected in parallel to an input node and each is capable of switching, wherein upon said switching each said JJ comparator is producing a feedback current, wherein each said JJ comparator has a flux threshold for said switching;
   at least one of flux bias devices, wherein said flux bias device is capable to adjust said flux threshold for at least one said JJ comparator; and
   wherein said superconductor circuit is so configured that each said JJ comparator is adapted to receive at least a portion of said feedback current, wherein said feedback current is capable to shift said flux threshold for each said JJ comparator.

2. The superconductor circuit of claim 1, wherein absent of said flux bias devices, said JJ comparators are essentially identical to one another.

3. The superconductor circuit of claim 2, wherein said flux bias devices are adapted to adjust said flux thresholds to differ from one another essentially by $\Phi_0/N$, where $\Phi_0$ is the flux quantum.

4. The superconductor circuit of claim 3, wherein a loop inductor pertains to each said JJ comparator, wherein said loop inductor is capable of transforming said portion of said feedback current into a flux bias applied to said JJ comparator.

5. The superconductor circuit of claim 4, wherein said feedback current is capable to shift said flux thresholds in a manner that said flux thresholds are reordered amongst said JJ comparators.

6. The superconductor circuit of claim 1, wherein said flux bias devices comprise inductive coupling inbetween superconducting lines.

7. The superconductor circuit of claim 1, wherein said superconductor circuit is characterized as being a multi-level quantizer.

8. The superconductor circuit of claim 7, wherein N is equal to $2^n-1$, where n is a positive integer greater than 1.

9. A method for converting an electromagnetic analog signal into a digital signal, said method comprising:
   connecting N Josephson junction (JJ) comparators in parallel to an input receiving said analog signal, wherein said N is at least two, and said JJ comparators have flux thresholds for switching, wherein said switching produces said digital signal;
   adjusting said flux thresholds individually to a predetermined set of flux values; and
   randomizing said flux thresholds with a feedback current, wherein said feedback current is generated by said switching of said JJ comparators.

10. The method of claim 9, wherein said predetermined set of flux values are selected to be essentially multiples of $\Phi_0/N$, where $\Phi_0$ is the flux quantum.

11. The method of claim 9, wherein said adjusting of said flux thresholds is achieved by applying at least one flux bias device.

12. The method of claim 11, further comprises electrically changing a flux amount produced by said flux bias device.

13. The method of claim 12, further comprises monitoring a digital noise in said digital signal, and controlling said changing of said flux amount to minimize said digital noise.

14. The method of claim 12, wherein said flux bias device is selected to comprise inductive coupling inbetween superconducting lines.

15. The method of claim 9, further comprises joining loop inductors to said JJ comparators, wherein said loop inductors transform said feedback current into shifts of said flux thresholds.

16. A superconductor Analog-to-Digital Converter (ADC), comprising:
- a multi-level quantizer, wherein said multi-level quantizer comprises:
  - a number N of Josephson junction (JJ) comparators, with said N being at least two, said JJ comparators are connected in parallel to an input node and each is capable of switching, wherein upon said switching each said JJ comparator is producing a feedback current, wherein each said JJ comparator has a flux threshold for said switching;
  - at least one of flux bias devices, wherein said flux bias device is capable to adjust said flux threshold for at least one said JJ comparator; and
  - wherein said superconductor circuit is so configured that each said JJ comparator is adapted to receive at least a portion of said feedback current, wherein said feedback current is capable to shift said flux threshold for each said JJ comparator.

17. The superconductor ADC of claim 16, wherein said ADC is characterized as being a bandpass ADC.

18. The superconductor ADC of claim 16, wherein said ADC is characterized as being a low-pass ADC.

19. The superconductor ADC of claim 16, wherein said ADC is characterized as being an oversampled ADC.

20. The superconductor ADC of claim 16, further comprising a digital converter, wherein said digital converter is adapted to convert a digital output from said multi-level quantizer into a multibit binary code.

* * * * *